(12) United States Patent
Jeong et al.

(10) Patent No.: US 9,106,261 B2
(45) Date of Patent: Aug. 11, 2015

(54) METHOD AND APPARATUS FOR TRANSMITTING SIGNALING INFORMATION IN DIGITAL BROADCASTING SYSTEM

(75) Inventors: Hong-Sil Jeong, Seoul (KR); Kyung-Joong Kim, Gyeongsangbuk-do (KR); Seok-Ki Ahn, Gyeongsangbuk-do (KR); Kyeongcheol Yang, Gyeongsangbuk-do (KR); Hyun-Koo Yang, Seoul (KR); Sung-Ryul Yun, Gyeonggi-do (KR)

(73) Assignees: Samsung Electronics Co., Ltd (KR); Postech Academy-Industry Foundation (KR)

( * ) Notice: Subject to any disclaimer, the term of this patent is extended or adjusted under 35 U.S.C. 154(b) by 72 days.

(21) Appl. No.: 13/402,427

(22) Filed: Feb. 22, 2012

(65) Prior Publication Data

US 2012/0216099 A1    Aug. 23, 2012

(30) Foreign Application Priority Data

Feb. 22, 2011  (KR) .................. 10-2011-0015374

(51) Int. Cl.
*H03M 13/03* (2006.01)
*H03M 13/11* (2006.01)
*H03M 13/00* (2006.01)
(Continued)

(52) U.S. Cl.
CPC ...... *H03M 13/1102* (2013.01); *H03M 13/1165* (2013.01); *H03M 13/6356* (2013.01); *H03M 13/6362* (2013.01); *H04L 1/0069* (2013.01); *H04H 60/07* (2013.01)

(58) Field of Classification Search
CPC ... H04L 1/0069; H04L 1/0066; H04L 1/0068; H04L 1/0041; H04L 27/04; H04L 27/06; H03M 13/6362; H03M 13/116; H03M 13/1194; H03M 13/1102; H03M 13/6393; H03M 13/6306; H03M 13/23; H03M 13/2792; H03M 13/2957; H04H 60/07
See application file for complete search history.

(56) References Cited

U.S. PATENT DOCUMENTS 6,370,669 B1 * 4/2002 Eroz et al. ..................... 714/774
6,430,227 B1 * 8/2002 Kroeger et al. ............... 375/260
(Continued)

FOREIGN PATENT DOCUMENTS

KR     1020070034904      3/2007
KR     1020070046477      5/2007
(Continued)

OTHER PUBLICATIONS

DVB Organization: "TM-NGH544_Generation of Additional Parity.pdf", Digital Video Broadcasting, Nov. 23, 2010.
(Continued)

*Primary Examiner* — Albert Decady
*Assistant Examiner* — Enamul M Kabir
(74) *Attorney, Agent, or Firm* — The Farrell Law Firm, P.C.

(57) ABSTRACT

A method and an apparatus for puncturing bits in parity bit groups in a digital broadcasting system are provided. In a method for transmitting signaling information in a digital broadcasting system, a received information bit stream is encoded and a parity bit is added. The parity bit is punctured such that parity bits of different patterns are formed between adjacent frames.

20 Claims, 7 Drawing Sheets

(51) Int. Cl.
*H04L 1/00* (2006.01)
*H04H 60/07* (2008.01)

(56) References Cited

U.S. PATENT DOCUMENTS

| | | | |
|---|---|---|---|
| 2002/0144209 A1* | 10/2002 | Ariel et al. | 714/792 |
| 2003/0081690 A1* | 5/2003 | Kim et al. | 375/264 |
| 2003/0128769 A1* | 7/2003 | Kim et al. | 375/265 |
| 2007/0101243 A1* | 5/2007 | Kim et al. | 714/790 |
| 2007/0113147 A1* | 5/2007 | Hong et al. | 714/758 |
| 2008/0046800 A1* | 2/2008 | Pietraski et al. | 714/790 |
| 2008/0307293 A1* | 12/2008 | Cheng | 714/790 |
| 2009/0154458 A1 | 6/2009 | Kim et al. | |
| 2010/0054353 A1* | 3/2010 | Roh et al. | 375/260 |
| 2010/0115372 A1* | 5/2010 | Trachewsky et al. | 714/752 |
| 2010/0211847 A1* | 8/2010 | Livshitz et al. | 714/752 |
| 2011/0119568 A1* | 5/2011 | Jeong et al. | 714/790 |
| 2011/0286544 A1* | 11/2011 | Avudainayagam et al. | 375/295 |

FOREIGN PATENT DOCUMENTS

| | | |
|---|---|---|
| WO | WO 2008/149216 | 12/2008 |
| WO | WO 2010/093097 | 8/2010 |

OTHER PUBLICATIONS

"Digital Video Broadcasting (DVB); Frame Structure Channel Coding and Modulation for a Second Generation Digital Terrestrial Television Broadcasting System (DVB-T2)", European Standard, European Telecommunications Standards Institute (ETSI), ETSI EN 302 755 V1.2.1, Feb. 1, 2011.

* cited by examiner

METHOD AND APPARATUS FOR TRANSMITTING SIGNALING INFORMATION IN DIGITAL BROADCASTING SYSTEM

PRIORITY

This application claims priority under 35 U.S.C. §119(a) to a Korean patent application filed in the Korean Intellectual Property Office on Feb. 22, 2011 and assigned Serial No. 10-2011-0015374, the contents of which are incorporated herein by reference.

BACKGROUND OF THE INVENTION

1. Field of the Invention

The present invention relates generally to a digital broadcasting system, and more particularly, to a method and an apparatus for transmitting signaling information in a digital broadcasting system.

2. Description of the Related Art

With the recent advances in high image quality digital Television (TV), Portable Multimedia Players (PMPs), and mobile broadcasting, further study has been devoted to methods of providing a broadcast service in a digital broadcasting system.

Accordingly, a standard for providing a broadcast service to a fixed or mobile receiver has been developed. Particularly, research and development for a Digital Video Broadcasting-Next Generation Handheld (DVB-NGH) for mobile terminals is in progress.

FIG. 1 illustrates a transmission frame structure of a conventional DVB-NGH system.

Referring to FIG. 1, a transmission frame of the DVB-NGH system includes a plurality of frames within one super frame 100. Each frame includes information of an L1-pre 110, 111, 112, and L1-post 120, 121, 122 representing configuration information, wherein the configuration information is required for obtaining data included in a relevant frame. Generally, the configuration information does not change every frame but changes on a super frame basis. For example, the configuration information may include a cell identifier, a network identifier, the number of frequency channels, a frame length, a pilot subcarrier position, a service identifier, a modulation scheme used for each service data transmission, and encoding rate information.

As described above, the information of the L1-pre 110, 111, 112, and the L1-post 120, 121, 122 does not change its content inside a super frame. Therefore, when an error occurs in decoding a frame, a receiver of a digital broadcasting system combines L1-pre and L1-post information of the current frame with L1-pre and L1-post information of a previous frame to decode data of a relevant frame.

However, when the above method is used, the receiver cannot recover data of a relevant frame until the L1-pre and L1-post information is normally received. Accordingly, there is a need in the art for a method for accurately and expeditiously decoding the L1-pre and L1-post information.

SUMMARY OF THE INVENTION

An aspect of the present invention is to address at least the above-mentioned problems and/or disadvantages and to provide at least the advantages described below. Accordingly, an aspect of the present invention is to provide a method and an apparatus for transmitting signaling information in a digital broadcasting system.

Another aspect of the present invention is to provide a method and an apparatus for setting configuration of a parity bit for signaling information differently for each frame in a transmitter of a digital broadcasting system.

Still another aspect of the present invention is to provide a method and an apparatus for performing puncturing of a different type for each frame on a parity bit of signaling information in a transmitter of a digital broadcasting system.

In accordance with an aspect of the present invention, a method for a transmitter that transmits signaling information in a digital broadcasting system includes receiving an information bit stream, encoding the received information bit stream to add a parity bit, and puncturing the parity bit such that parity bits of different patterns are formed between adjacent frames.

In accordance with an aspect of the present invention, an apparatus for a transmitter that transmits signaling information in a digital broadcasting system includes an encoder for receiving an information bit stream, encoding the received information bit stream to add a parity bit, and a puncturing unit for puncturing the parity bit such that parity bits of different patterns are formed between adjacent frames.

In accordance with an aspect of the present invention, a method for a receiver that receives signaling information in a digital broadcasting system includes receiving a codeword having parity bits of different patterns between adjacent frames from a transmitter, and determining a position of parity bits of different patterns between adjacent frames.

In accordance with an aspect of the present invention, an apparatus for a receiver that receives signaling information in a digital broadcasting system includes a demodulator for receiving and demodulating a codeword having parity bits of different patterns between adjacent frames from a transmitter, and a puncture pattern estimator for estimating a position of parity bits of different patterns between adjacent frames.

BRIEF DESCRIPTION OF THE DRAWINGS

The above and other aspects, features and advantages of certain embodiments of the present invention will be more apparent from the following description taken in conjunction with the accompanying drawings in which.

Throughout the drawings, like reference numerals will be understood to refer to like parts, components and structures.

DETAILED DESCRIPTION OF EMBODIMENTS OF THE INVENTION

The following description with reference to the accompanying drawings is provided to assist in a comprehensive understanding of embodiments of the invention as defined by the claims and their equivalents. Those of ordinary skill in the art will recognize that various changes and modifications of the embodiments described herein can be made without departing from the scope and spirit of the invention. Also, descriptions of well-known functions and constructions are omitted for the sake of clarity and conciseness.

The terms and words used in the following description and claims are not limited to their dictionary meanings, but are merely used by the inventor to enable a clear and consistent understanding of the invention. Accordingly, it should be apparent to those skilled in the art that the following description is provided for illustration purposes only and not for the purpose of limiting the invention as defined by the appended claims and their equivalents.

Figure 1:
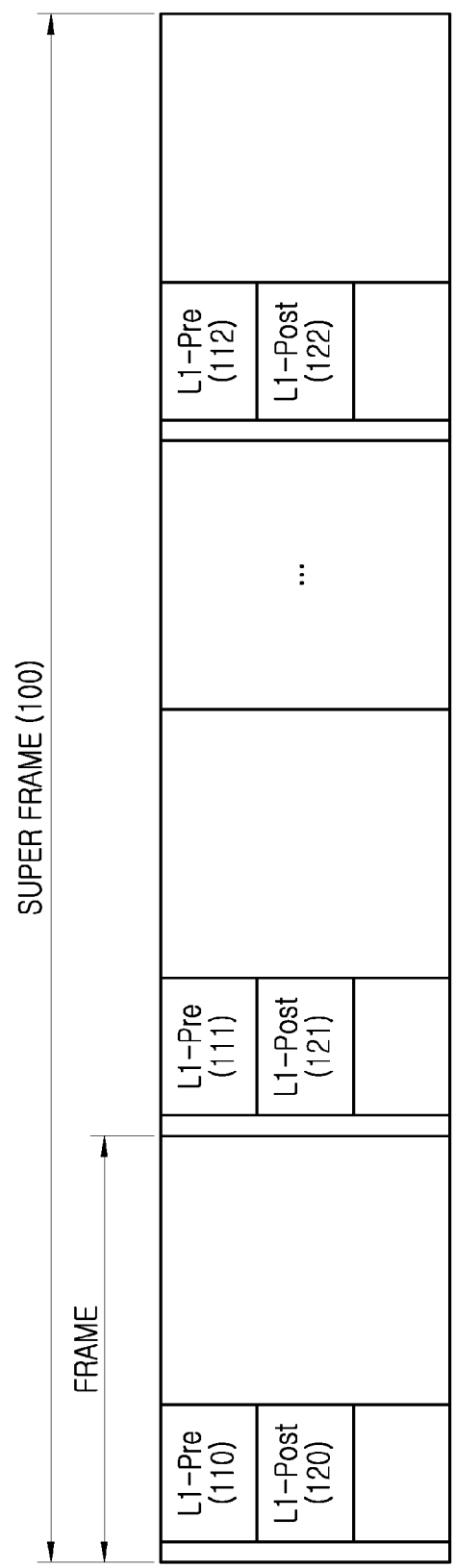
FIG. 1 illustrates a transmission frame structure of a conventional DVB-NGH system.
Figure 2:
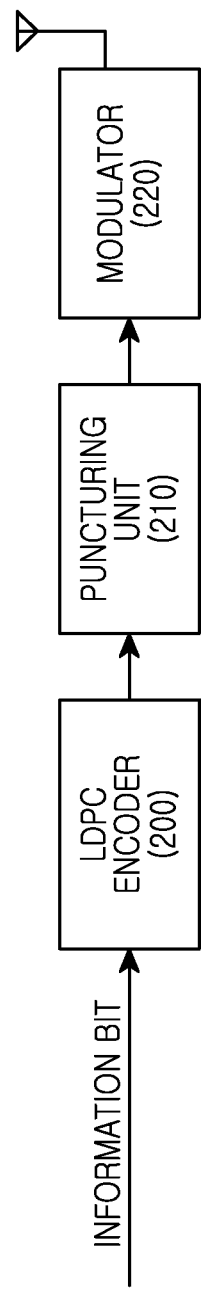
FIG. 2 illustrates a transmitter according to an embodiment of the present invention.

FIG. 2 illustrates a transmitter according to an embodiment of the present invention.

Referring to FIG. 2, the transmitter includes a Low Density Parity Check (LDPC) encoder 200, a puncturing unit 210, and a modulator 220.

The LDPC encoder 200 performs LDPC encoding on an input information bit stream to generate an LDPC codeword, and provides the generated LDPC codeword to the puncturing unit 210. The information bit stream denotes information bits forming L1-pre and/or L1-post information in the frame. That is, the LDPC encoder 200 divides the input information bit stream into at least one block, and inserts a padding bit into each information block depending on the size of divided each information block. The padding bit is for dividing each information block as a bit stream of a same size. The padding bit may not be inserted depending on the size of each information block. After that, the LDPC encoder 200 adds a parity bit of the same size to each information block into which the padding bit has been inserted to generate an LDPC codeword. That is, when the information block K into which the padding has been inserted is X bits, X parity bits may be added.

A puncturing method is for processing a specific portion as erasure at a reception end by simply not transmitting a specific information bit or the specific portion of a parity bit.

The puncturing unit 210 receives an LDPC codeword from the LDPC encoder 200, and performs puncturing on a portion of parity bits included in the LDPC codeword. Specifically, the puncturing unit 210 determines the number of all puncturing bits for parity bits included in the LDPC codeword.

Figure 3:
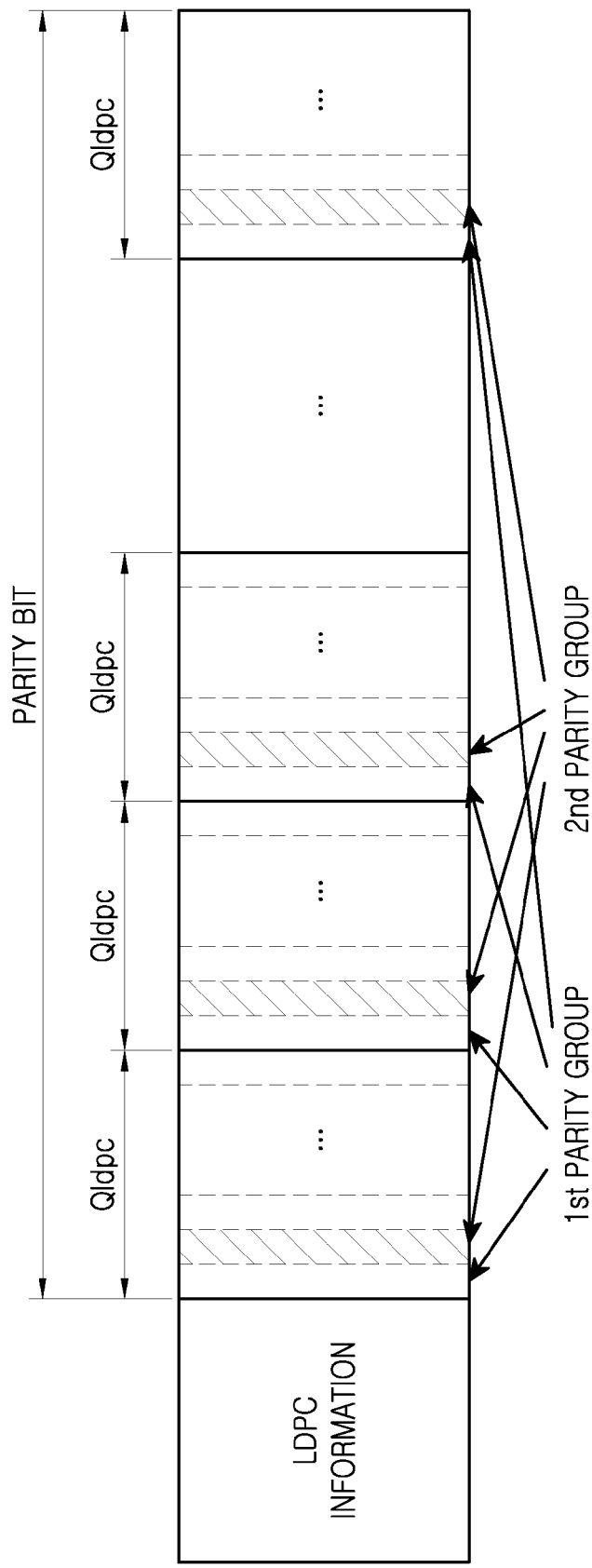
FIG. 3 illustrates grouping of a parity bit according to an embodiment of the present invention.

After that, the puncturing unit 210 classifies parity bits included in the LDPC codeword into a plurality of blocks using a number of bits as a reference, and groups bits included in each block into a plurality of parity groups. For example, as illustrated in FIG. 3, the puncturing unit 210 classifies the parity bits into a plurality of blocks $Q_{1dpc}$ having a number of bits, and then groups the parity bits into a plurality of parity groups by grouping first bits of respective blocks into a first parity group, and grouping second bits of respective blocks into a second parity group.

After that, the puncturing unit 210 determines the number of parity groups to puncture depending on the determined number of all puncturing bits. The number of parity groups to puncture may be determined using Equation (1), as follows.

$$N_{punc\_group} = \left\lfloor \frac{N_{punc}}{M} \right\rfloor, 0 \leq N_{punc} < N_{1dpc} - K_{1dpc} \quad (1)$$

where $N_{punc\_group}$ is the number of parity groups to be punctured, $N_{punc}$ is the number of bits to be punctured, M is the number of bits of each parity group, $N_{1dpc}$ is the number of bits of an LDPC codeword, and $K_{1dpc}$ is the number of bits of information.

The puncturing unit 210 determines the number of parity groups to be punctured, and performs puncturing on a parity bit with consideration of a current frame. That is, the puncturing unit 210 performs puncturing on parity bits included in the LDPC codeword considering the number of parity groups to be punctured.

At this point, the puncturing unit 210 selects a different parity group for each frame, and then performs puncturing on the selected parity group. The puncturing unit 210 selects different parity groups for adjacent frames so that the adjacent frames do not include the same parity bit. For example, the puncturing unit 210 selects an odd-numbered parity group with respect to an odd-numbered frame to perform puncturing on bits of the selected odd-numbered parity group, and selects an even-numbered parity group with respect to an even-numbered frame to perform puncturing on bits of the selected even-numbered parity group, so that the odd-numbered frame and the even-numbered frame may include parity bits of different patterns.

In more detail, the puncturing unit 210 punctures parity bits corresponding to the number of all puncture bits using a method of puncturing parity bits of a first parity group in an odd-numbered frame, and puncturing parity bits of a third parity group. In addition, the puncturing unit 210 punctures parity bits corresponding to the number of all puncture bits using a method of puncturing parity bits of a second parity group in an even-numbered frame, and puncturing parity bits of a fourth parity group.

A parity group to be punctured with respect to each frame may be selected using other methods. For example, a method for selecting a parity group to puncture with respect to each frame may be defined using a table or a function. However, the method for selecting a parity group to be punctured with respect to each frame, as illustrated in FIG. 4, should be configured such that parity bits of different patterns are formed between adjacent frames.

Figure 4:
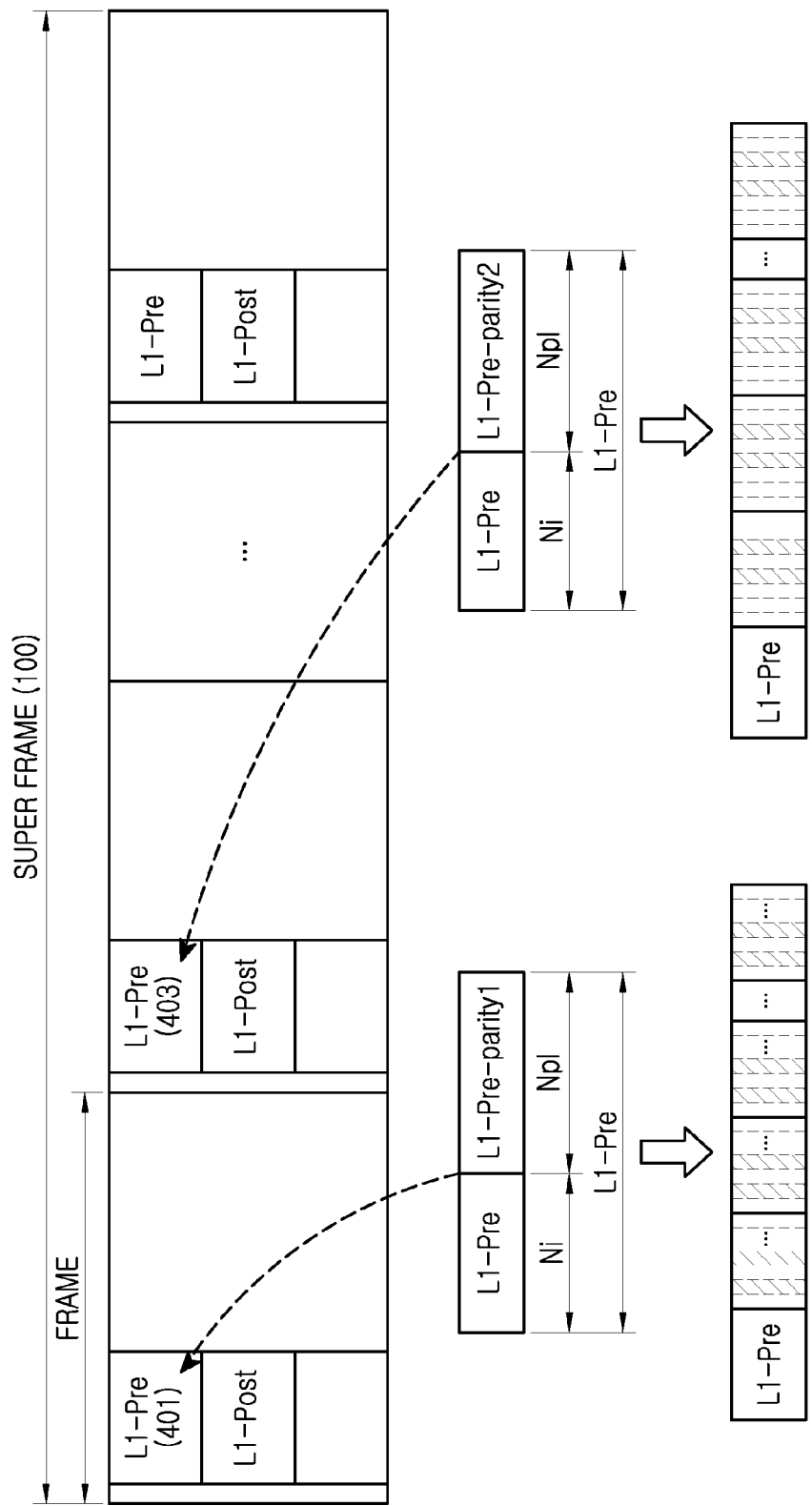
FIG. 4 illustrates a transmission frame structure having a parity bit of a different pattern for each frame according to an embodiment of the present invention.

FIG. 4 illustrates a transmission frame structure having a parity bit of a different pattern for each frame according to an embodiment of the present invention, and is an example of performing LPDC encoding and puncturing on L1-pre information. The above-described LPDC encoding and puncturing may be performed on L1-post information.

As described above, the puncturing unit 210 that has performed puncturing on an LDPC codeword provides a punctured codeword to the modulator 220.

The modulator 220 modulates the punctured codeword and transmits the same to a receiver via an antenna.

Figure 5:
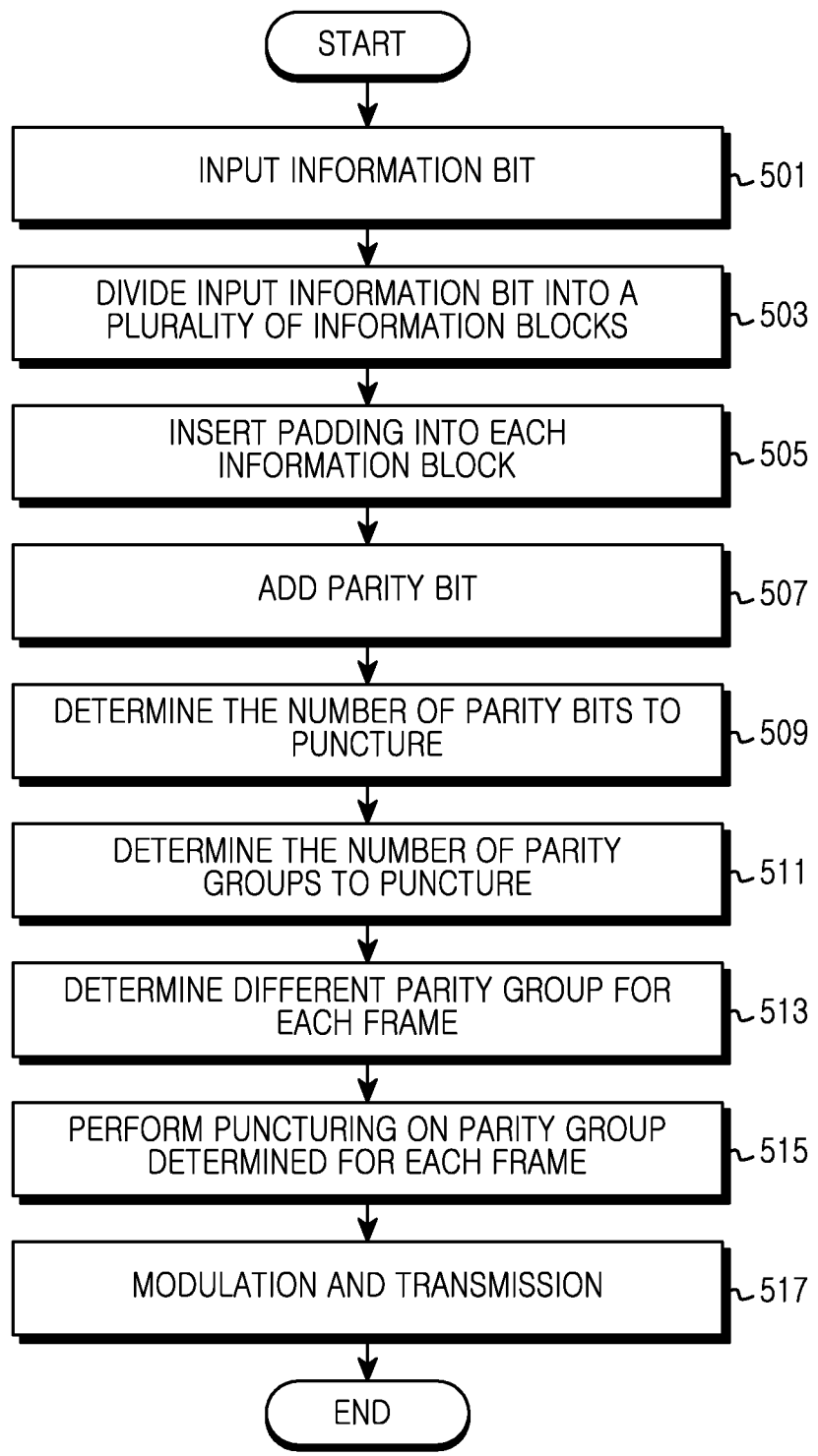
FIG. 5 illustrates a procedure for operating a transmitter according to an embodiment of the present invention.

FIG. 5 illustrates a procedure for operating a transmitter according to an embodiment of the present invention.

Referring to FIG. 5, the transmitter receives an information bit stream in step 501, and proceeds to step 503 to divide the received information bit stream into at least one information block. That is, the transmitter may divide an information bit stream into a plurality of information blocks or make the information bit stream one information block depending on the size of an input information bit stream and a method set in advance. The information bit stream denotes information bits forming L1-pre and L1-post information in the frame.

The transmitter inserts a padding bit into each information block in step 505. The padding bit is for dividing each information block as a bit stream of the same size. The padding bit may not be inserted depending on the size of each information block.

The transmitter adds a parity bit of a same size to each information block into which the padding bit has been inserted to generate an LDPC codeword in step 507. That is, when the information block K into which the padding bit has been inserted is X bits, X parity bits may be added.

The transmitter determines the number of parity bits to be punctured included in the LDPC codeword in step 509.

The transmitter classifies parity bits included in the LDPC codeword into a plurality of blocks using a number of bits as a reference, groups parity bit included in each block into a plurality of parity groups, and then determines the number of parity groups to be punctured according to the number of parity bits to be punctured in step 511. The number of parity groups to be punctured may be determined using Equation (1). For example, the transmitter, as illustrated in FIG. 3, classifies the parity bits into a plurality of blocks $Q_{1dpc}$ having a number of bits, and then groups the parity bits into a plurality of parity groups by grouping first bits of respective blocks into a first parity group, and grouping second bits of respective blocks into a second parity group, and determines the number of parity groups to be punctured using Equation (1).

The transmitter determines at least one parity group to be punctured considering a current frame, in step 513. The transmitter selects different parity groups for adjacent frames so that the adjacent frames do not include the same parity bit. For example, the transmitter may select an odd-numbered parity bit with respect to an odd-numbered frame, and may select an even-numbered parity bit with respect to an even-numbered frame. The transmitter may determine a parity group to puncture with respect to each frame via a table or a function defined in advance. A method for selecting a parity group to puncture with respect to each frame should be configured such that adjacent frames include parity bits of different patterns as illustrated in FIG. 4.

The transmitter performs puncturing on a determined parity group depending on a frame in step 515. That is, the transmitter determines parity groups to puncture with respect to a current frame, and then punctures parity bits included in the determined parity groups.

For example, when the transmitter selects an odd-numbered parity group with respect to an odd-numbered frame, the transmitter punctures parity bits corresponding to the number of all puncture bits using a method of puncturing parity bits of an odd-numbered parity group such as a first parity group and a third parity group in an odd-numbered frame. In addition, when the transmitter selects an even-numbered parity group with respect to an even-numbered frame, the transmitter punctures parity bits corresponding to the number of all puncture bits using a method of puncturing parity bits of a second parity group and a fourth parity group in an even-numbered frame.

The transmitter modulates an LDPC codeword on which puncturing has been performed to transmit the same to a receiver via an antenna in step 515, and then ends the algorithm according to an embodiment of the present invention.

Figure 6:
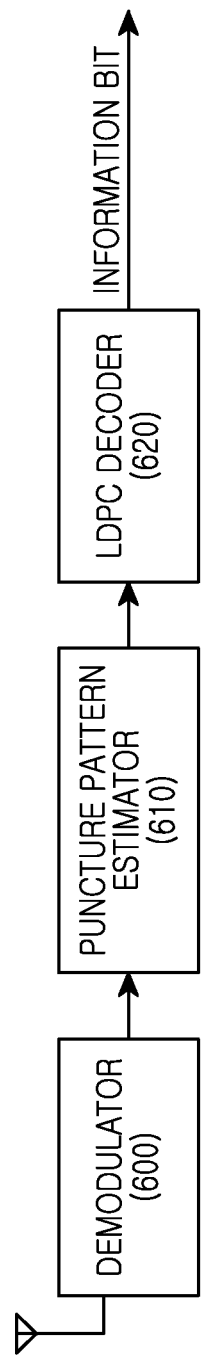
FIG. 6 illustrates a receiver according to an embodiment of the present invention.

FIG. 6 illustrates a receiver according to an embodiment of the present invention.

Referring to FIG. 6, the receiver includes a demodulator 600, a puncture pattern estimator 610, and an LDPC decoder 620.

The demodulator 600 demodulates a signal received from a transmitter via an antenna, to obtain a punctured codeword, and provides the punctured codeword to the puncture pattern estimator 610.

As described above, the puncturing method denotes a method of substantially not transmitting a specific portion. Therefore, a reception end determines the not-transmitted portion as erasure. Since position information for punctured bits may be shared or estimated by a transmission end and a reception end, the reception end processes relevant punctured bits simply as erasure to perform decoding. The puncture pattern estimator 610 receives a punctured codeword from the demodulator 600, and estimates or determines information regarding a punctured pattern of a code from the punctured codeword to transfer the position information of the punctured bit to the LDPC decoder 620.

That is, the puncture pattern estimator 610 calculates the number of parity groups that are estimated to be punctured with respect to the codeword according to a method set in advance with the transmitter, determines that a different parity group has been punctured for each frame, and then obtains the position of the determined parity group. For example, the puncture pattern estimator 610 determines that an odd-numbered parity group has been punctured with respect to an odd-numbered frame, and determines that an even-numbered parity group has been punctured with respect to an even-numbered frame to recover position information of a parity bit generated via encoding by the transmitter.

Though a parity group of each frame may be selected using other methods, the methods should be set in advance with the transmitter. For example, a method of selecting a parity group of each frame may be defined using a table or a function, and this should be defined to correspond to a puncturing method of the transmitter.

The LDPC decoder 620 performs LDPC decoding on a codeword recovered by the puncture pattern estimator 610 to obtain an information bit. The LDPC decoder 620 decodes the recovered codeword using a decoding method corresponding to an encoding method of the transmitter, and then outputs the decoded information bit.

Figure 7:
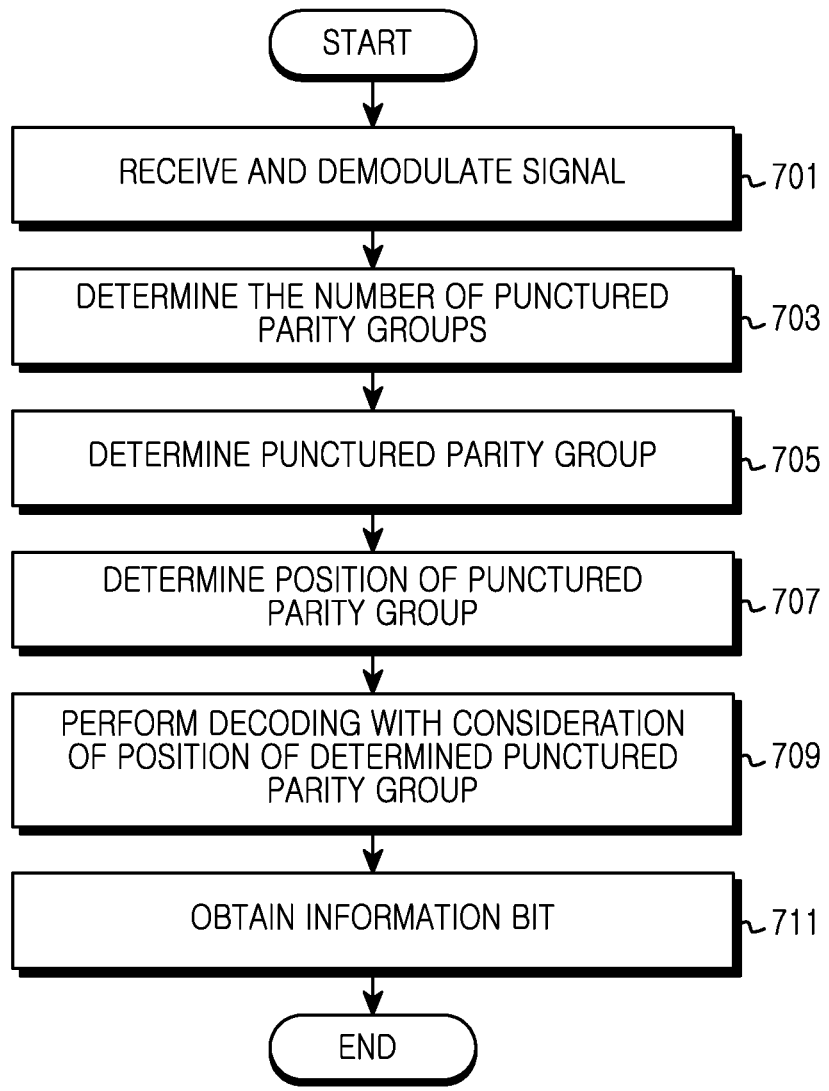
FIG. 7 illustrates a procedure for operating a receiver according to an embodiment of the present invention.

FIG. 7 illustrates a procedure for operating a receiver according to an embodiment of the present invention.

Referring to FIG. 7, the receiver demodulates a signal received from a transmitter via an antenna to obtain a punctured codeword in step 701.

The receiver determines the number of parity groups punctured by the transmitter with respect to the punctured codeword in step 703, and proceeds to step 705 to determine a punctured parity group with respect to the codeword considering the determined number of parity groups and a current frame. The receiver determines the position of the determined parity group in step 707. That is, the receiver calculates the number of parity groups that are estimated to be punctured with respect to the codeword according to a method set in advance with the transmitter, determines that a different parity group has been punctured for each frame, and then determines the position of the parity group punctured for each frame.

For example, the receiver determines that an odd-numbered parity group has been punctured with respect to an odd-numbered frame to determine that the position of the odd-numbered parity group has been punctured, and determines that an even-numbered parity group has been punctured with respect to an even-numbered frame to determine that the position of the even-numbered parity group has been punctured. Though a parity group of each frame may be selected using other methods, the methods should be set in advance with the transmitter. For example, a method of selecting a parity group of each frame may be defined using a table or a function, and this should be defined to correspond to a puncturing method of the transmitter.

The receiver performs LDPC decoding on the recovered codeword using a decoding method corresponding to an encoding method of the transmitter in step 709, thereby obtains an information bit in step 711. The method then ends.

According to the present invention, a transmitter of a digital broadcasting system performs a different type of puncturing on a parity bit of signaling information for each frame to produce a different configuration of a parity bit for signaling information for each frame, so that probability that an error occurs when a reception end recovers signaling information may be reduced.

Although the invention has been shown and described with reference to embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A method for a transmitter that transmits signaling information in a digital broadcasting system, the method comprising:
   receiving an information bit stream;
   encoding the received information hit stream; and
   puncturing one or more parity bits such that parity bits of different patterns are formed adjacent frames, the puncturing comprising:
      grouping parity bits into a plurality of parity groups;
      selecting different parity groups in adjacent frames; and
      performing puncturing on the selected different parity groups.

2. The method of claim 1, wherein selecting the different parity groups between the adjacent frames comprises:
   selecting an odd-numbered parity group with respect to an odd-numbered frame, and selecting an even-numbered parity groups with respect to an even-numbered frame.

3. The method of claim 1, wherein selecting the different parity groups between the adjacent frames comprises:
   selecting one or more parity groups according to a pre-defined table or function.

4. The method of claim 1, wherein the encoding the received information bit stream comprises:
   dividing the input information bit stream into at least one information block;
   inserting padding into each information block; and
   adding at least one parity bit to the each information block into which the padding has been inserted.

5. An apparatus for a transmitter that transmits signaling information in a digital broadcasting system, the apparatus comprising:
   an encoder configured to receive and encode an information bit stream; and
   a puncturing unit configured to puncture one or more parity bits such that parity bits of different patterns are formed in adjacent frames, the puncturing comprising:
      grouping parity bits into a plurality of parity groups; and
      selecting different parity groups in adjacent frames; and
      performing puncturing on the selected different parity groups.

6. The apparatus of claim 5, wherein the puncturing unit selects an odd-numbered parity groups with respect to an odd-numbered frame, and selects an even-numbered parity groups with respect to an even-numbered frame.

7. The apparatus of claim 5, wherein the puncturing nit selects the one or more parity groups according to a pre-defined table or function.

8. The apparatus of claim 5, wherein the encoder is further configured to divide the input information bit stream into at least one information block, to insert padding into each information block, and to add at least one parity bit to each information block into which the padding has been inserted.

9. The apparatus of claim 5, further comprising a modulator for modulating output bits from the puncturing unit.

10. A method for a receiver that receives signaling information in a digital broadcasting system, the method comprising:
    receiving a codeword having parity bits in as digital broadcast signal from a transmitter; and
    determining positions of parity bits which form different patterns in adjacent frames, the determining comprising:
       determining blocks of parity bits in each frame; and
       determining parity groups in each block, where the determined parity groups form different patterns in adjacent frames.

11. The method of claim 10, wherein determining the parity groups of different patterns between the adjacent frames comprises:
    selecting an odd-numbered parity groups with respect to an odd-numbered frame, band selecting an even-numbered parity groups with respect to an even-numbered frame.

12. The method of claim 10, wherein determining the parity groups of different patterns between the adjacent frames comprises:
    selecting the parity groups according to a pre-defined table or function,
    wherein each frame comprises Low Density Parity Check (LDPC) information comprising information bit stream, and a plurality of parity groups.

13. An apparatus for a receiver that receives signaling information in a digital broadcasting system, the apparatus comprising:
    a demodulator configured to receive and demodulate a codeword having parity bits in a digital broadcast signal from a transmitter; and
    a puncture pattern estimator configured to estimate positions of parity bits which form different patterns in adjacent frames by:
       determining blocks of parity bits in each frame; and
       determining parity groups in each block, where the determined parity groups form different patterns in adjacent frames.

14. The apparatus of claim 13, wherein the puncture pattern estimator determines each position of the determined parity groups by selecting odd-numbered parity groups with respect to an odd-numbered frame, and selecting even-numbered parity groups with respect to an even-numbered frame.

15. The apparatus of claim 13, wherein the puncture pattern estimator determines each position of the determined parity groups by selecting the parity groups according to a pre-defined table or function,
    wherein each frame comprises Low Density Parity Check (LDPC) information comprising information bit stream, and a plurality of parity groups.

16. The apparatus of claim 13, further comprising:
    a decoder configured to perform decoding considering each estimated position of parity bits.

17. The method of claim 1, further comprising:
    determining a number of total puncturing bits for parity bits; and
    determining as number of parity groups to puncture based on the number of total puncturing bits and the number of bits of each parity group, wherein the selecting different parity groups in adjacent frames comprises selecting parity groups in each frame based on the determined number of parity groups;

wherein the each frame comprises Low Density Parity Check (LDPC) information comprising information bit stream, and the plurality of parity groups.

18. The method of claim 1, further comprising:
broadcasting the encoded and punctured information bit stream to a plurality of receivers.

19. The apparatus of claim 5, wherein the puncturing unit determines a number of total puncturing bits for parity bits, determines a number of parity groups to puncture based on the number of total puncturing bits and the number of bits of each parity group, and selects the parity groups in each frame based on the determined number of parity groups;
wherein the each frame comprises Low Density Parity Check (LDPC) information comprising information bit stream, and the plurality of parity groups.

20. The apparatus of claim 5, further comprising:
broadcasting the encoded and punctured information bit stream to a plurality of receivers.

* * * * *